US008170311B2

(12) United States Patent
Ying (10) Patent No.: US 8,170,311 B2
(45) Date of Patent: May 1, 2012

(54) TOEPLITZ RANDOM ENCODING FOR REDUCED ACQUISITION IN COMPRESSED SENSING MAGNETIC RESONANCE IMAGING

(75) Inventor: Lei Ying, Kenosha, WI (US)

(73) Assignee: The UWM Research Foundation, Inc., Milwaukee, WI (US)

( * ) Notice: Subject to any disclaimer, the term of this patent is extended or adjusted under 35 U.S.C. 154(b) by 498 days.

(21) Appl. No.: 12/434,870

(22) Filed: May 4, 2009

(65) Prior Publication Data

US 2009/0274356 A1 Nov. 5, 2009

Related U.S. Application Data

(60) Provisional application No. 61/050,008, filed on May 2, 2008.

(51) Int. Cl.
*G06K 9/00* (2006.01)
(52) U.S. Cl. .................. 382/128; 382/131; 382/132
(58) Field of Classification Search .................. 382/128, 382/131; 600/410, 437; 324/310, 311, 312
See application file for complete search history.

(56) References Cited

U.S. PATENT DOCUMENTS

| 2008/0228446 | A1* | 9/2008 | Baraniuk et al. .............. 702/189 |
| 2009/0096449 | A1* | 4/2009 | Foxall .......................... 324/311 |

OTHER PUBLICATIONS

Sebert, et al., "Toeplitz Block Matrices in Compressed Sensing", submitted to IEEE Transactions on Information Theory, Jan. 10, 2008.
Lustig, M., et al., "Sparse MRI: The Application of Compressed Sensing for Rapid MR Imaging", Magnetic Resonance in Medicine 58: pp. 1182-1195, Dec. 2007.
Gamper, U., et al., "Compressed Sensing in Dynamic MRI", Magnetic Resonance in Medicine 59: 365-373, 2008.
Candes, et al., "Robust Uncertainty Principles: Exact Signal Reconstruction from Highly Incomplete Frequency Information", IEEE Transactions on Information Theory, vol. 52, No. 2, pp. 489-509, 2006.
Donoho, D., "Compressed Sensing", IEEE Transactions on Information Theory, vol. 52, No. 4, pp. 1289-1306, Apr. 2006.
Haldar J.P., et al., "Data Acquisition Considerations for Compressed Sensing in MRI", Joint Annual Meeting ISMRM-ESMRMB, Berlin, p. 829, 2007.
Sebert, et al., "Compressed Sensing MRI with Random B1 Field", ISMRM, Toronto, Canada, May 3-9, 2008.

(Continued)

*Primary Examiner* — Joseph Chang
*Assistant Examiner* — Jeffrey Shin
(74) *Attorney, Agent, or Firm* — Michael Best & Friedrich LLP (57) ABSTRACT

A method and a system for generating a magnetic resonance image of a subject. The method and system include generating a first pulse having first random data having a first amplitude and a first linear phase; applying the first pulse to the subject as an radio frequency pulse; collecting a first signal from the subject; generating a second pulse having second random data having a second amplitude and a second linear phase, wherein the second amplitude is substantially equal to the first amplitude, and wherein the second phase has a different slope from the first phase; applying the second pulse to the subject as an radio frequency pulse; collecting a second signal from the subject; and reconstructing an image of the subject.

22 Claims, 10 Drawing Sheets

OTHER PUBLICATIONS

Sebert, et al., "Toeplitz Block Matrices in Compressed Sensing and their Applications in Imaging", Proceedings of the 5th International Conference on Information Technology and Application in Biomedicine, in conjunction with The 2nd International Symposium & Summer School on Biomedical and Health Engineering, Shenzhen, China, pp. 47-50, May 30-31, 2008.

Pauly, et al., "A k-Space Analysis of Small-Tip-Angle Excitation" Journal of Magnetic Resonance 81: 43-56, 1989.

Wright, G., "Magnetic Resonance Imaging", IEEE Signal Processing Magazine, vol. 14, No. 1, pp. 56-66, Jan. 1997.

Oh, C, et al., "Line-Integral Projection Reconstruction (LPR) with Slice Encoding Techniques: Multislice Regional Imaging in NMR Tomography," IEEE Transactions on Medical Imaging, vol.MI-3, No. 4, pp. 170-178, Dec. 1984.

Healy, M., et al., "Two Applications of Wavelet Transforms in Magnetic Resonance Imaging," IEEE Transactions Information Theory, vol. 38, No. 2, pp. 840-862, Mar. 1992.

Lustig, M., et al., "Rapid MR Imaging with "Compressed Sensing" and Randomly Under-Sampled 3DFT Trajectories", 2006.

Lustig, M., et al., "Multi-slice Compressed Sensing Imaging", 2007.

Baraniuk, R., et al., "A Simple Proof of the Restricted Isometry Property for Random Matrices", Constructive Approximation, 2007.

Bajwa, W., et al., "Toeplitz-Structured Compressed Sensing Matrices", IEEE SSP Workshop, 294-298, 2007.

Candes E.J., et al., "Sparsity and Incoherence in Compressive Sampling", Inverse Problems 23: 969-985, IOP Publishing, 2007.

Candes, et al., "Decoding by Linear Programming", IEEE Transactions on Information Theory, vol. 51, No. 12, pp. 4203-4215 Dec. 2005.

Weaver, J., "Wavelet-Encoded MR Imaging," Magnetic Resonance in Medicine, vol. 24, pp. 275-287, 1992.

Candes, et al., "Sparse Signal and Image Recovery from Compressive Samples", IEEE ISBI, 976-979, 2007.

Optimization code from http://www.acm.caltech.edu/l1magic/, at least as early as Apr. 7, 2009.

Block, et al., "Undersampled Radial MRI with Multiple Coils. Iterative Image Reconstruction Using a Total Variaion Constraint", Magnetic Resonance in Medicine 57: 1086-1098, 2007.

Zientara, G., et al., "Dynamically Adaptive MRI with Encoding by Singular Value Decomposition," Magnetic Resonance in Medicine, vol. 32, No. 2, pp. 268-274, 1994.

Wang, et al., "Toeplitz Random Encoding for Reduced Acquisition Using Compressed Sensing", Proceedings of International Society of Magnetic Resonance in Medicine Scientific Meeting, 2009.

Hoge, W., "A Doubly Adaptive Approach to Dynamic MRI Sequence Estimation," IEEE Transactions on Image Processing, vol. 11,, No. 11, pp. 1168-1178, Oct. 2002.

Healy, D., et al. "Adapted Waveform Encoding for Magnetic Resonance Imaging," IEEE Engineering in Medicine and Biology, vol. 14, pp. 621-638, 1995.

* cited by examiner

TOEPLITZ RANDOM ENCODING FOR REDUCED ACQUISITION IN COMPRESSED SENSING MAGNETIC RESONANCE IMAGING

CROSS-REFERENCE TO RELATED APPLICATIONS

This application claims priority to U.S. Provisional Application No. 61/050,008, filed May 2, 2008, which is incorporated herein by reference in its entirety.

STATEMENT REGARDING FEDERALLY SPONSORED RESEARCH OR DEVELOPMENT

This invention was made with government support under CBET-0731226 awarded by the National Science Foundation. The government has certain rights in the invention.

BACKGROUND

The present invention relates to magnetic resonance imaging using compressed sensing.

According to theory, magnetic resonance imaging (MRI) using compressed sensing can allow recovery of a sparse signal, or a signal that can be made sparse by transformations, from a highly incomplete set of samples, and thus has the potential for significant reduction in MRI scan time.

SUMMARY

In one embodiment, the invention provides a method of generating a magnetic resonance image of a subject, the method including generating a first pulse having first random data having a first amplitude and a first linear phase; applying the first pulse to the subject as an radio frequency pulse; collecting a first signal from the subject; generating a second pulse having second random data having a second amplitude and a second linear phase, wherein the second amplitude is substantially equal to the first amplitude, and wherein the second phase has a different slope from the first phase; applying the second pulse to the subject as an radio frequency pulse; collecting a second signal from the subject; and reconstructing an image of the subject.

In another embodiment the invention provides a magnetic resonance imaging system. The magnetic resonance system has a processor and includes software stored on a computer readable medium. The software is executable by the processor for effecting a method of generating a magnetic resonance image of a subject. The method includes generating a first pulse having first random data having a first amplitude and a first linear phase; applying the first pulse to the subject as an radio frequency pulse; collecting a first signal from the subject; generating a second pulse having second random data having a second amplitude and a second linear phase, wherein the second amplitude is substantially equal to the first amplitude, and wherein the second phase has a different slope from the first phase; applying the second pulse to the subject as an radio frequency pulse; collecting a second signal from the subject; and reconstructing an image of the subject.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Compressed sensing (CS) magnetic resonance imaging (MRI) is a method for reconstructing high-dimensional sparse or transform sparse signals from a relatively small number of linear measurements. A signal can be made sparse using a number of standard transformations, including for example a finite difference transformation, a discrete cosine transformation, or a wavelet transformation. Whereas conventional MRI sampling must satisfy Shannon's theorem, i.e. minimum sampling rate must be twice the signal bandwidth, CS allows MRI images to be produced from data that has been sampled well below the Nyquist rate and still permit recovery of a signal.

The main idea of CS is to exploit the fact that there is some structure and redundancy in most signals of interest. CS is well suited for application in MRI, as the sampled linear combinations in MRI are simply individual Fourier coefficients, which are k-space data. CS typically starts with acquisition of a limited number of samples in a different basis than the basis in which the signal is known to be sparse. As the number of samples is limited, the task of converting the image back into the intended domain involves solving an underdetermined matrix equation.

Figure 1A:
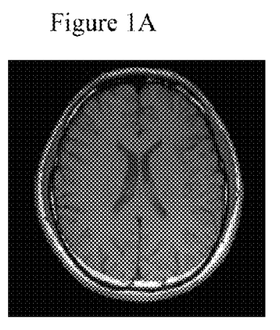
FIG. 1A shows an original image of a brain region of a subject.
Figure 1B:
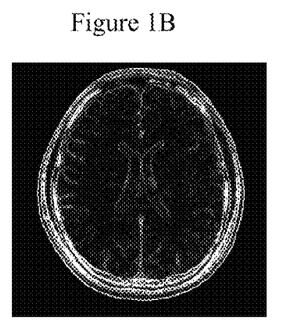
FIG. 1B shows the image of FIG. 1A after a finite difference transformation.
Figure 1C:
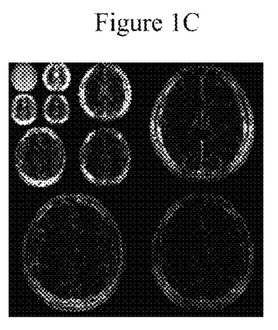
FIG. 1C shows the image of FIG. 1A after various wavelet transformations have been performed.

In order to use CS in MRI, three requirements should generally be met: (1) the acquisition data should be sparse after some appropriate transformations (e.g., by finite difference (FIG. 1B), wavelet transform (FIG. 1C), etc.); (2) the sampled data should be encoded by some sensing waveform that is incoherent with the sparsifying basis, rather than the direct pixel values; and (3) a nonlinear reconstruction algorithm should be used to reconstruct an image from the measurements.

According to CS MRI theory, images with a sparse representation can be recovered from randomly undersampled k-space data using nonlinear convex programming. Since completely random sampling trajectories are typically not feasible in MRI practice due to hardware and physiological constraints, most attention has been focused on the design of practical sampling schemes whose incoherence properties are close to those of random undersampling.

If either the MRI receiver coil sensitivities or the radio frequency (RF) excitation profiles can be designed to be spatially random, then an image can be recovered from uniformly undersampled k-space data. The present invention provides an alternative to the random sampling design for reducing the acquisition time using CS and has the advantage that the number of samples needed is less than what is needed in the random sampling scheme.

Thus, in CS theory, it has been determined that for a matrix $\Phi$ to be a suitable CS matrix, it is sufficient that it satisfies the following Restricted Isometry Property (RIP) condition:

$$(1-\delta_s)\|x\|_2^2 \leq \|\Phi x\|_2^2 \leq (1+\delta_s)\|x\|_2^2 \text{ where } \delta_s \epsilon (0,1) \quad [1]$$

If the k×n encoding matrix $\Phi$ (where k<n) has RIP for any x with sparsity S, then the original signal x can be reconstructed exactly, with overwhelming probability, from very few samples (given by a vector y), by solving the convex optimization problem:

$$\text{Minimize } \|x\|_1 \text{ subject to } \Phi x = y \quad [2]$$

where $\|x\|_1$ is the $L_1$ norm. It has been shown that if the observation matrix $\Phi$ is a block random Toeplitz matrix, then the encoding matrix $\Phi$ is a suitable CS matrix. For the applications considered here, the block Toeplitz matrix has the form shown in equation [3], where k<n and the elements $a_{ij}$ are drawn independently from certain probability distributions.

$$\Phi = \begin{bmatrix} A_n & A_{n-1} & & A_2 & A_1 \\ A_1 & A_n & & A_3 & A_2 \\ \vdots & & \ddots & & \\ A_{k-1} & A_{k-2} & \cdots & A_{k+1} & A_k \end{bmatrix}, \quad [3]$$

$$A_i = \begin{bmatrix} a_{in} & a_{i(n-1)} & & a_{i2} & a_{i1} \\ a_{i1} & a_{in} & & a_{i3} & a_{i2} \\ \vdots & & \ddots & & \\ a_{i(n-1)} & a_{i(n-2)} & \cdots & a_{i1} & a_{in} \end{bmatrix}$$

This indicates that this Toeplitz matrix $\Phi$ satisfies RIP with probability $1-\exp(-ckn/S^2)$ for some constant c depending only on $\delta_s$ provided that the number of samples $kn \geq c_2 \cdot S^3 \log(n/S)$, for any x of size $n^2$ with sparsity of S. To interpret the sensing matrix in MR acquisition, x is the desired image, multiplication with a block Toeplitz matrix represents partial sampling of a two-dimensional convolution on a uniform Cartesian grid. It is known that convolution in k-space is equivalent to pixel by pixel products in the image domain.

Therefore, if the image has a sparse representation (e.g. wavelet basis) and the coil sensitivity or excitation profile is spatially random, then the image can be reconstructed from uniformly undersampled k-space data on a Cartesian grid. The degree of randomness in the sensitivity determines how "incoherent" the encoding operation is, and thus affects the minimum number of samples required for reconstruction. Although the coil sensitivity or excitation profile cannot be completely random due to practical constraints, their quality can be evaluated by the level of incoherence in the encoding matrix $\Phi$. The fact that the boundary of random Toeplitz block matrices is lower than that of random sampling in Fourier encoding indicates that the random profile design would likely require a smaller number of samples than random Fourier sampling does.

Accordingly, to reduce the acquisition time, we have developed a random, non-Fourier encoding method. The encoding method gives a block Toeplitz random encoding matrix that satisfies the requirements for CS MRI listed above. The phase encodings can thereby be undersampled and images can be reconstructed from the reduced data using a constrained L1 minimization.

Thus, in various embodiments, the methods disclosed herein use one-dimensional (1D) random Toeplitz encoding along the y direction as phase encoding and 1D Fourier encoding along the x direction as frequency encoding. The corresponding encoding matrix is a block Toeplitz random matrix, which satisfies the CS requirements. The desired image can be reconstructed using a nonlinear algorithm. To realize such an encoding scheme in an actual MRI scanner, a random RF pulse (generally a pseudo-random RF pulse) with a linear phase is generated and used for the first excitation. The subsequent excitations then use pulses with the same amplitude but different slope in linear phase from the previous. This corresponds to a shift by a fixed amount in the excitation profile.

Figure 2:
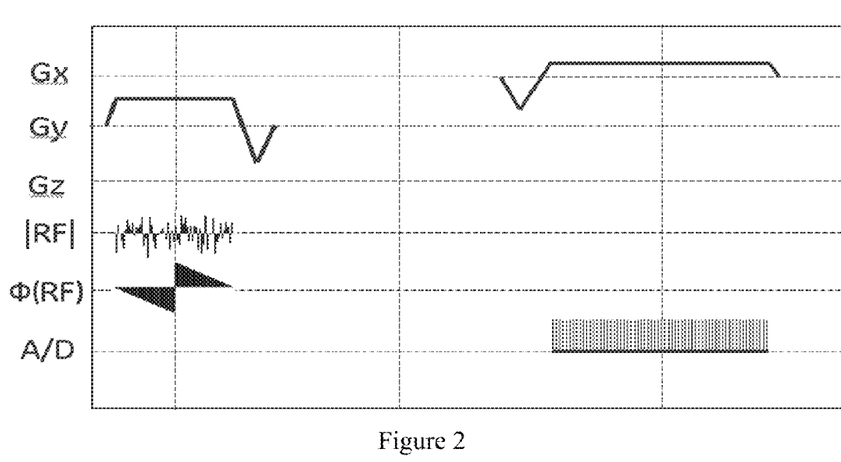
FIG. 2 shows a timing diagram of the pulse sequence for Toeplitz random encoding without slice selection.

A fixed gradient Gy is turned on with the RF pulse for each excitation. According to the MR physics of magnetization with small tip angles, each excitation profile should be $$M(r) = j\gamma M_0(r)\int_0^T B_1(t)e^{jk(t)\cdot r} \quad [4]$$

which depends on the Fourier transform of the random pulse B(t). Each random RF pulse generates a random excitation profile in 1D along the y direction. The linear phase shift is designed such that the excitation profiles from consecutive excitations are spatially shifted by a single pixel along the y direction. After RF excitation, the phase encoding Gy gradient is turned off to realize the Toeplitz random encoding along y, but the frequency encoding Gx gradient is still on for Fourier encoding along x. For a square field of view, the gradient Gy is designed to satisfy $$Gx \Delta t_{AD} = Gy \Delta t_{RF} \quad [5]$$

where $\Delta t_{AD}$ and $\Delta t_{RF}$ are the A/D acquisition and RF excitation sampling period. FIG. 2 shows a timing diagram of a typical pulse sequence. To reduce data acquisition, in certain embodiments only the first few excitations are carried out and the reduced data are used to reconstruct the desired image using compressed sensing.

Image x is reconstructed by solving the convex optimization problem, wherein $\|\Psi x\|_1$ is minimized subject to:

$$\|\Phi x - y\|_2 < \epsilon \quad [6]$$

where $\Psi$ is the sparsity basis, y is the acquired data after a 1D Fourier transform along the frequency encoding direction, and $\Phi$ is the Toeplitz random encoding matrix defined in Eq. [7]:

$$\Phi = \begin{bmatrix} A & 0 & \cdots & 0 \\ 0 & A & \cdots & 0 \\ \vdots & \vdots & \ddots & \vdots \\ 0 & 0 & \cdots & A \end{bmatrix}, \quad [7]$$

$$A = \begin{bmatrix} a_1 & a_2 & & a_{n-1} & a_n \\ a_2 & a_3 & & a_n & a_1 \\ \vdots & & \ddots & & \\ a_n & a_1 & \cdots & a_{n-2} & a_{n-1} \end{bmatrix}$$

The matrix A in Eq. [7] has a Toeplitz structure, where the independent elements $a_1, \ldots, a_n$ are the Fourier transform of the RF pulse in the first excitation. Due to the special property of Toeplitz matrices, the image reconstruction has a fast algorithm, whose complexity is about the same as compressed sensing for randomly sampled Fourier encoding.

Figure 3A:
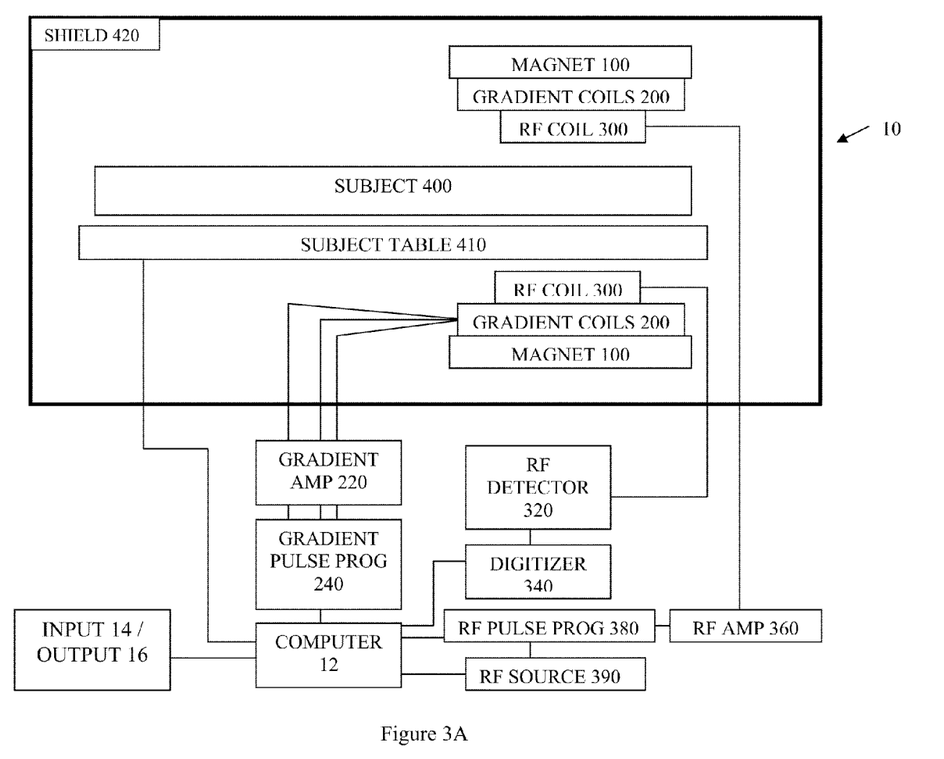
FIG. 3A shows a schematic block diagram of a typical commercial MRI scanner system.

In various embodiments, the methods described herein are implemented on an MRI system. A schematic block diagram of a typical commercial MRI scanner system 10 is shown in FIG. 3A. The system includes one or more magnets 100, one or more gradient coils 200, one or more RF coils 300, and a subject table 410 for supporting a subject 400, all of which are surrounded by a shield 420. The gradient coil(s) 200 are connected to a gradient amplifier 220 and a gradient pulse program 240, which in turn are connected to a computer 12. The RF coil(s) 300 are connected to and RF amplifier 360, an RF pulse program 380, an RF detector 320, an RF source 390, and a digitizer, which in turn are connected to the computer 12.

Figure 3B:
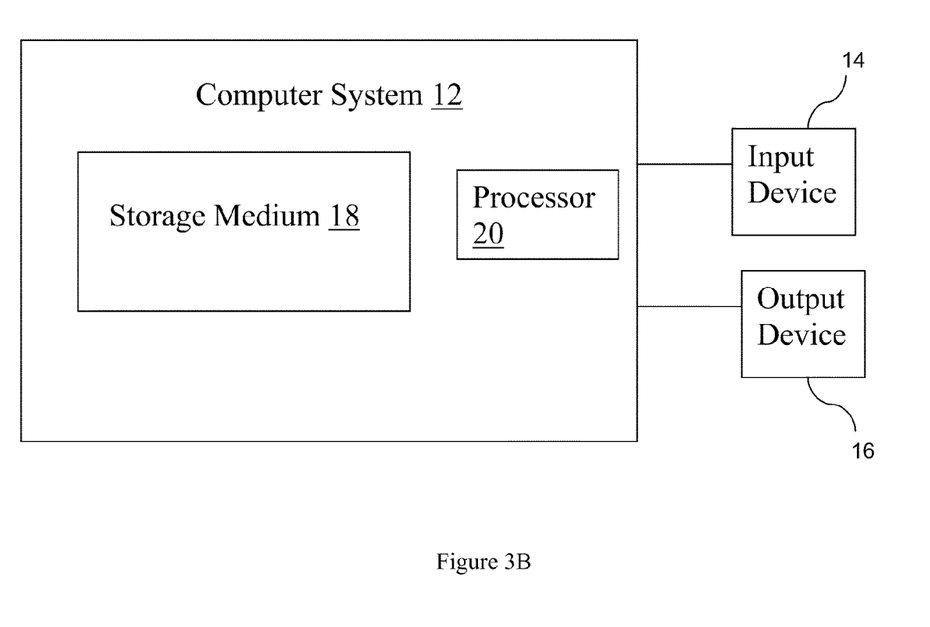
FIG. 3B shows a schematic block diagram of a computer for use with the MRI scanner shown in FIG. 3A.

The computer 12 includes input 14 and output 16 devices as well as a computer-readable storage medium 18 and a processor 20 (FIG. 3B). Possible input devices 14 include a keyboard, a computer mouse, a touch screen, and the like. Output devices 16 include a cathode-ray tube (CRT) computer monitor, a liquid-crystal display (LCD) computer monitor, and the like. Computer-readable storage media 18 include various types of memory such as a hard disk, RAM, flash memory, and other magnetic, optical, physical, or electronic memory devices. The processor 20 is any typical computer processor for performing calculations and directing other functions for performing input, output, calculation, and display of data in the disclosed calculator.

In various embodiments, the computer 12 is programmed to carry out the methods described herein. An operator of the MRI scanning system 10 uses the input device(s) 14 to instruct the system 10, typically through the computer 12, to perform steps of the methods as appropriate. The computer 12 includes software stored on the computer-readable storage medium 18, which is executable by the processor 20 and which includes instructions for directing the MRI scanner system 10 to generate first and second pulses (e.g. such as the pulse sequence shown in FIG. 2) and to apply the pulses to the subject 400 as an RF pulse. In various embodiments, the step of applying the pulses includes turning on or off various phase, frequency encoding, and/or slice selection gradients (e.g. Gx, Gy, and/or Gz), which may be fixed gradients. After applying the pulse to the subject 400, the computer 12 then directs the MRI scanner system 10 to collect a signal from the subject 400 using the RF coil 300. The signal ("A/D" in FIG. 2) obtained by the RF coil 300 is fed into the RF detector 320, through the RF digitizer 340 ("A/D" in FIG. 2), and sent to the computer 12 for storage and further processing.

In various embodiments, the second pulse that is applied to the subject 400 has similar characteristics to the first pulse, for example the amplitude (|RF| in FIG. 2) of the second pulse is substantially equal to the amplitude of the first pulse, except that the phase ($\Phi$(RF) in FIG. 2) of the second pulse has a different slope from the phase of the first pulse. In some embodiments, the change in the slope of the phase between the first and the second pulse produces a one-pixel shift in the excitation profile, although other changes in the slope are also possible.

As discussed, the pulses (e.g. such as the pulse sequence shown in FIG. 2) include randomly-generated RF signals. In various embodiments the randomly-generated signals are created using conventional pseudo-random number generation methods on a computer. To generate the second and subsequent pulses, the same random pattern from the first pulse may be repeated but with appropriate changes in the phase, slope, or amplitude of the signal, or a new random signal may be generated. If a new random signal is generated each time, the signal can be constrained to have the same or different phase, slope, or amplitude, as appropriate, although the exact pattern of the signal may differ.

Although the discussion herein mentions a first pulse and a second pulse, any number of pulses can be applied along with concomitant data collection steps as necessary.

After a suitable amount of data has been collected, the computer 12 then performs calculations to reconstruct an image from the collected data. In various embodiments, the computer executes software to implement the convex optimization approach discussed above, although other approaches may also be used. The reconstructed data are then conveyed to the operator of the MRI scanning system 10, for example by displaying on the output device 16.

Other configurations of the system 10 are also possible. In various embodiments the subject may be a human, an animal, or a phantom object.

Figure 4:
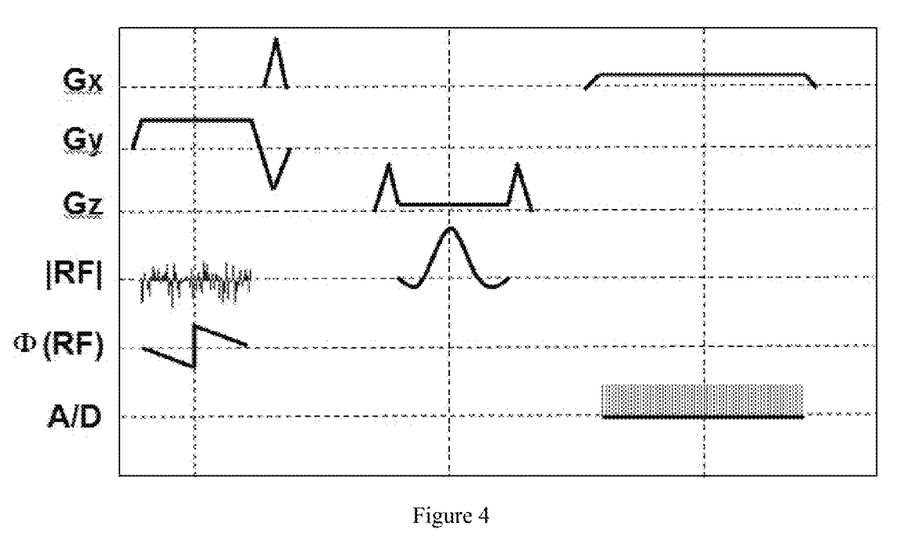
FIG. 4 shows a timing diagram of a pulse sequence for obtaining image slices in CS MRI using Toeplitz random encoding.
Figure 5:
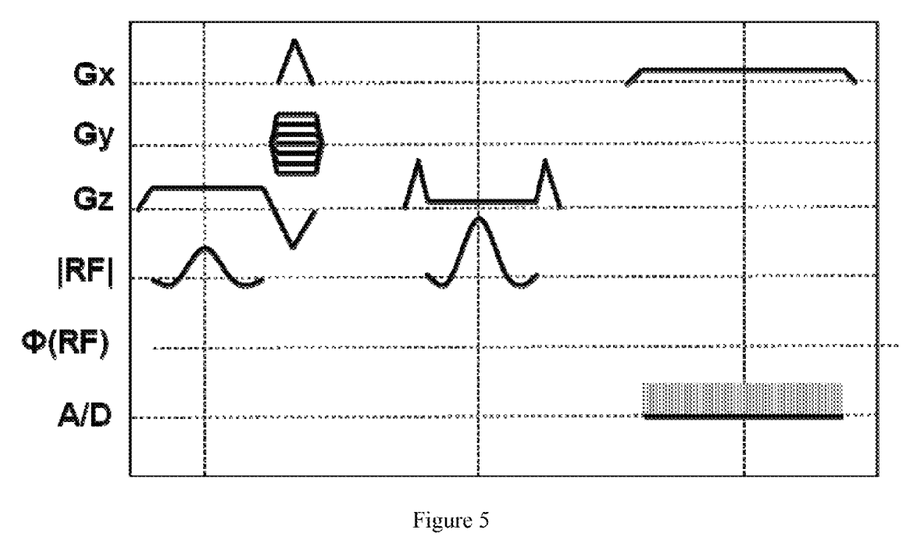
FIG. 5 shows a timing diagram of a pulse sequence for obtaining image slices in conventional spin-echo MRI.

In some embodiments, MR slices are obtained. The difference between pulse sequences for obtaining slices in CS MRI and in conventional MRI can be seen by comparing FIGS. 4 and 5. As shown in FIG. 4, in the |RF| signal, the random pulse is followed by a sinc-shaped pulse which generates a 180 degree flip angle for the slice that is selected by Gz. The Gz signal has two overshoots which are called crushers. In the conventional spin-echo MRI pulse sequence shown in FIG. 5, the RF pulses include a sinc-shaped pulse which generates a 90 degree flip angle and then a sinc-shaped pulse which generates a 180 degree flip angle, both for the slice that is selected by Gz.

EXAMPLES

Example 1

Bloch simulation was used to study Toeplitz random encoding method. Bloch simulation is known to be a very accurate way to study the effect of a pulse sequence on magnetization.

Figure 6:
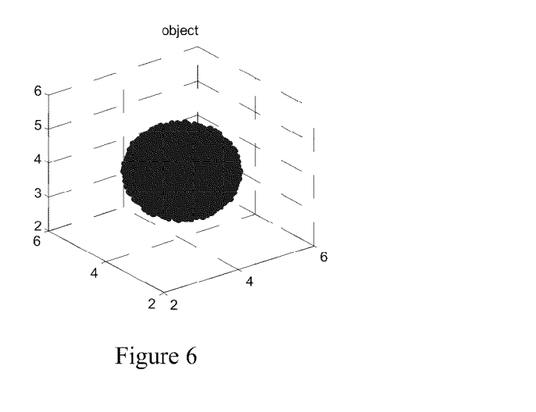
FIG. 6 shows a sphere for use with Bloch simulation.
Figure 7:
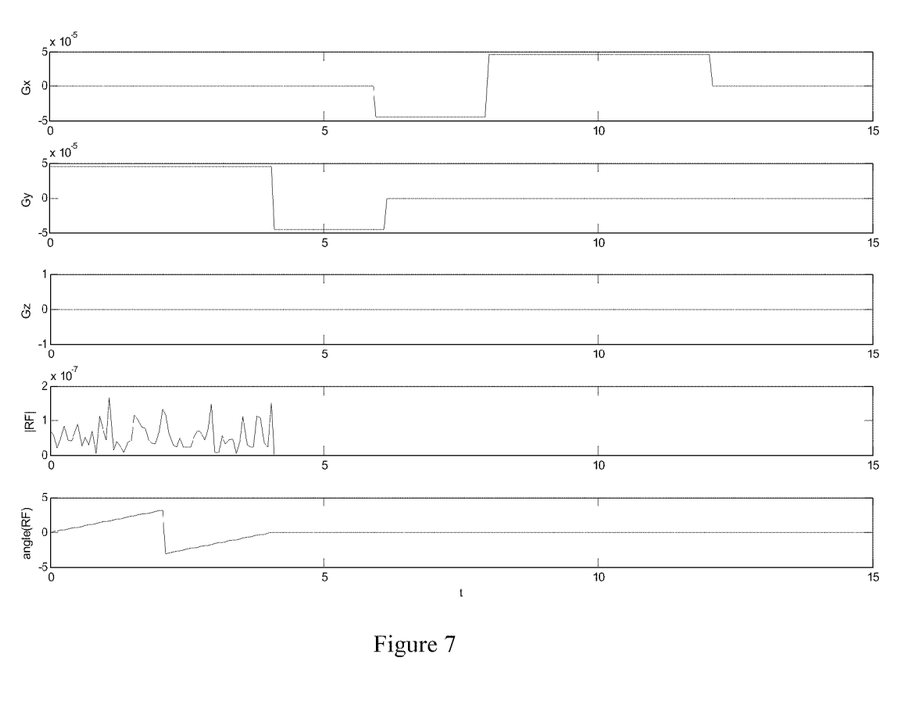
FIG. 7 shows a timing diagram of the pulse sequence for Toeplitz random encoding used in Bloch simulation.

According to the MR physics of the net magnetization, the effect of an RF pulse is to transfer energy from the transmitting coil to the protons. This excess energy results in a non-Boltzmann distribution of the population of the parallel and the anti-parallel energy states. Each of the magnetization components must return to its thermal equilibrium value over time. The time evolutions are characterized by differential equations as follows.

$$\begin{cases} \dfrac{dM_x}{dt} = \gamma M_y \left(B_0 - \dfrac{\omega}{\gamma}\right) - \dfrac{M_x}{T_2} \\ \dfrac{dM_y}{dt} = \gamma M_z B_1 - \gamma M_x \left(B_0 - \dfrac{\omega}{\gamma}\right) - \dfrac{M_y}{T_2} \\ \dfrac{dM_z}{dt} = -\gamma B_1 M_y - \dfrac{M_z - M_0}{T_1} \end{cases} \quad [8]$$

where $M_x$, $M_y$, and $M_z$ are the x, y and z components of the net magnetization; $B_0$ is RF pulse waveform; $B_1$ is Equilibrium Magnetic Field; and $\gamma$ is the gyromagnetic ratio. Based on the Bloch equations, the simulation of Toeplitz random encoding algorithm is done on MATLAB. The simulation assumes that echo time (TE) is 10 ms; repetition time (TR) is 15 ms; the duration of RF pulse is 4.096 ms; and the field of view is 8 cm. A sphere having a radius of 5 cm is considered as the proposed object (FIG. 6). The timing diagram of the pulse sequence for Bloch simulation is illustrated in FIG. 7.

Figure 8A:
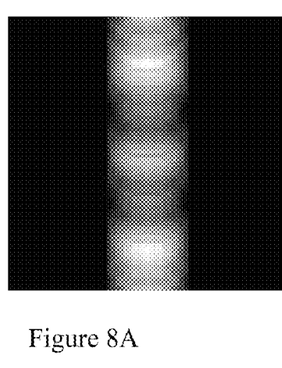
FIG. 8A shows Bloch simulation results of the sphere of FIG. 6 after a one-dimensional (1D) Fourier Transformation.
Figure 8B:
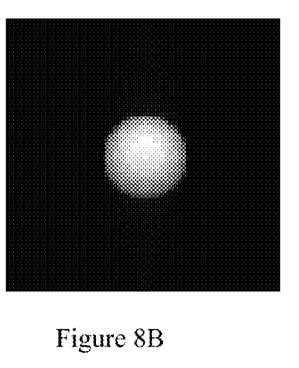
FIG. 8B shows a linear reconstruction of the sphere of FIG. 6 from the fully-sampled Bloch simulation data.
Figure 8C:
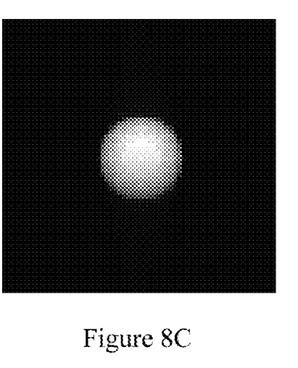
FIG. 8C shows the CS reconstruction from the reduced-sampled Bloch simulation data corresponding to the sphere of FIG. 6.

The simulation results show that an image can be reconstructed using half of the data (FIGS. 8A-8C). FIG. 8A shows the acquired (64×64 pixel) data after 1D Fourier Transformation. FIG. 8B shows the linear reconstruction from the fully-sampled (64×64 pixel) data. FIG. 8C shows the CS reconstruction from the reduced-sampled (32×64) data.

Example 2

In one particular implementation of Toeplitz random encoding, GE EPIC programs were executed on a GE MR Scanner. GE EPIC is a programming language, a development environment, and a runtime environment for creating MR pulse sequences. A pulse is a combination of linear orthogonal gradients (X, Y, Z), RF excitation, and data collection which generates MR data. It is typically an excitation with a certain phase-encoding value followed by a data acquisition step. For example, if 128 phase encodings were needed for a particular application, then instead of generating a train of 128 pulses each with a different phase encoding value, the above sequence would be repeated 128 times with the phase encoding amplitude modified prior to starting the hardware.

Pulse sequences were generated using EPIC source files (.e) in accordance with embodiments of the present invention. In the "@global" section, macros were declared to generate random numbers:

```
#include "math.h"
#include <stdlib.h>
#include <time.h>
#define DMAX(a,b) (((a) > (b)) ? (a) : (b))   /* maximum of a and b */
#define DABS(x) (((x) < 0) ? -(x) : (x))      /* absolute value of x */
```

In the "@ipgexport" section, Standard C for both the Host and IPG PSD processes were declared as follows:

```
int seed__rndm = 0;           /* seed for random function */
double* p__rndm = NULL;       /* point for storing random matrix*/
int w__rndm = 0;              /* width of random matrix */
int h__rndm = 0;              /* length of random matrix */
```

In the function "pulsegen(•)" of the "@pg" section, the Box-Muller algorithm was implemented to generate a Gaussian random matrix for RF random pulse sequence, which is completely stored as "rfpulse.txt" file.

```
seed__rndm = (unsigned)time(NULL); ); /* seed number from timer */
srand(seed__rndm);                    /* reset seed of random function */
p__rndm = (double*)malloc(sizeof(double)*(long)(w__rndm*h__rndm));
......  /* Box-Muller Method for Gaussian Random Matrix */
```

Similar modifications were made in the function "scan(•)" of "@rsp", "cvinit(•)", "cveval(•)" and "predownload(•)" of "@host", and "pulsegen(•)" of "@pg" section.

After compiling the EPIC source files (.e), EPIC-based pulse sequence designs (PSDs) were generated. Using WTools, a primary development tool for developing and simulating PSDs, pulse sequence waveforms such as those shown in FIG. 2 were developed.

The reconstruction used data file ("*.7") and pulse file ("rfpulse.txt") to solve the nonlinear optimization equations. Here, l1-magic and SparseMRI package on MATLAB were used to recover the MR images.

Experiments were performed in a 3 Tesla (3T) commercial MRI scanner (GE Healthcare, Waukesha, Wis.) with a single-channel coil using Toeplitz random encoding sequence (TE=10 ms, TR=1200 ms, 3.2 ms RF pulse, 20 cm FOV, 64×64 matrix). Two experimental demonstrations using phantoms were conducted.

Figure 9A:
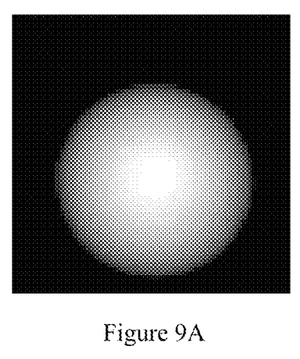
FIG. 9A shows a reconstruction from fully-sampled data with Fourier encoding.
Figure 9B:
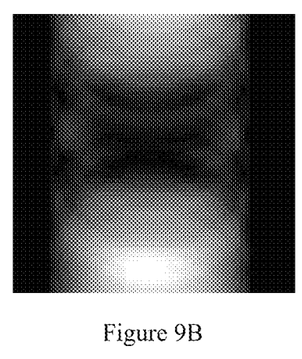
FIG. 9B shows acquired data of Toeplitz random encoding after a 1D Fourier Transform.
Figure 9C:
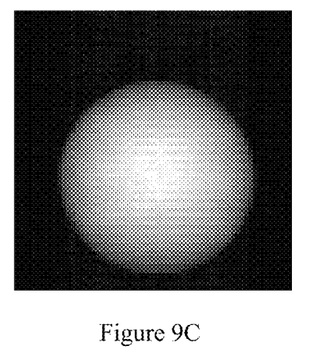
FIG. 9C shows a linear reconstruction from full random encoded data.

The first experiment, in which a ball was used as the object phantom, shows that the Toeplitz random encoding method works for full data sets. FIGS. 9A-9C show a reconstruction from fully-sampled (64×64 pixel) data with Fourier encoding (FIG. 9A); acquired data of Toeplitz random encoding after a 1D Fourier Transform (FIG. 9B); and a linear reconstruction from full random encoded data (FIG. 9C).

Figure 10A:
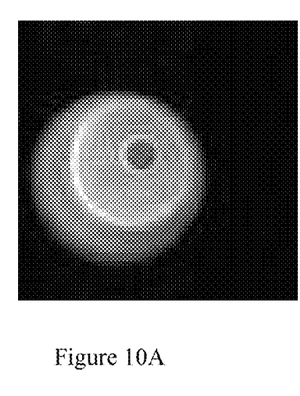
FIG. 10A shows a linear reconstruction from fully-sampled data of another sample.
Figure 10B:
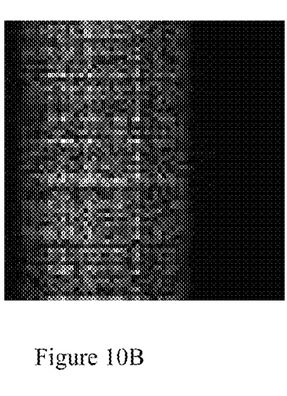
FIG. 10B shows a minimum energy linear reconstruction from reduced data of the sample of FIG. 10A.
Figure 10C:
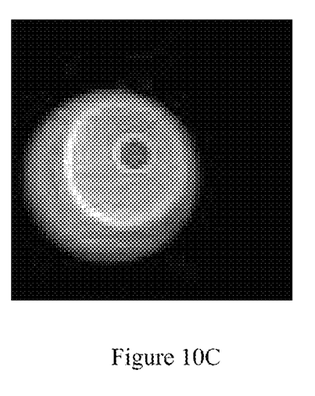
FIG. 10C shows a CS reconstruction from reduced data of the sample of FIG. 10A.

The second experiment used a ball and a cylinder as the phantom. The CS reconstruction result from the reduced data is seen to be very close to the linear reconstruction from the fully-sampled data. FIGS. 1A-10C illustrate the reconstructed images from the acquired data, in which $L_1$ norm was used as the sparse representation. FIG. 10A shows the linear reconstruction from the fully-sampled (64×64) data. FIG. 10B shows the minimum energy linear reconstruction from the reduced (48×64) data by reduction factor of 1.5. FIG. 10C shows the CS reconstruction from the reduced (48×64) data by a reduction factor of 1.5.

Example 3

Figure 11:
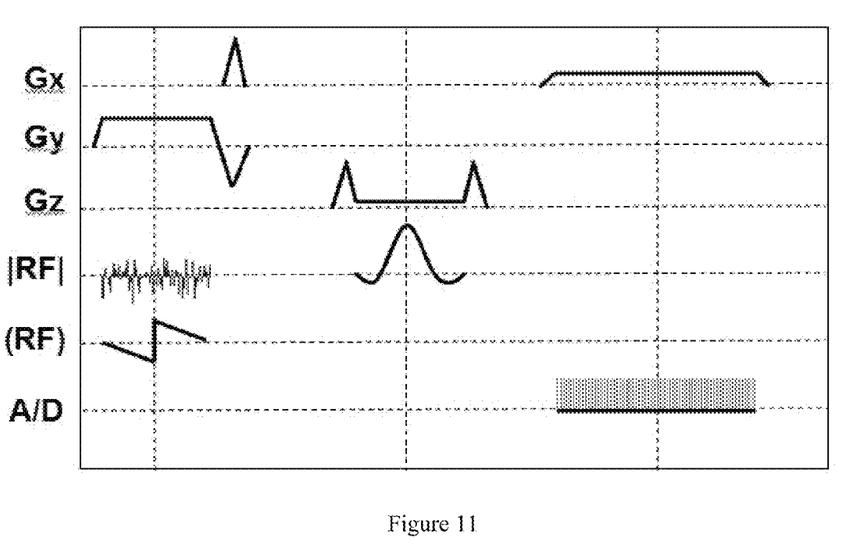
FIG. 11 shows a timing diagram of a Toeplitz encoding pulse sequence with slice selection.

In another implementation of Toeplitz random encoding, phantom images were acquired from a 3T commercial MRI scanner (GE Healthcare, Waukesha, Wis.), using the following values: TE=30 ms, TR=1000 ms, 6.4 ms RF pulse, 16 cm field of view (FOV), and a 64×64 matrix. An identity transform and finite difference both were used as the sparse representation. The timing diagram of the Toeplitz pulse sequence is shown in FIG. 11.

Figure 12A:
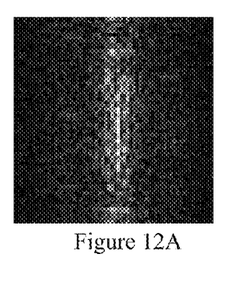
FIG. 12A shows raw data for a phantom.
Figure 12B:
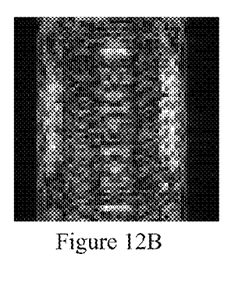
FIG. 12B shows the data of FIG. 12A after a 1D Fourier Transform (FT)
Figure 12C:
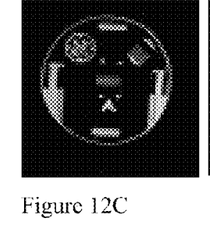
FIG. 12C shows a CS reconstruction of the phantom from the reduced data (reduction factor R=1.5) acquired through Toeplitz random encoding using the pulse sequence in FIG. 11.
Figure 12D:
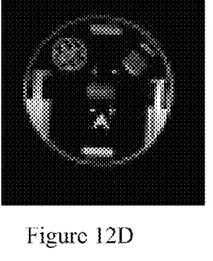
FIG. 12D shows a CS reconstruction of the phantom from the reduced data (R=1.5) acquired through Fourier encoding with 1D variable density random sampling.
Figure 12E:
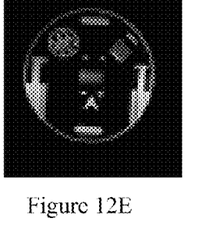
FIG. 12E shows a Fourier reconstruction of the phantom from the fully sampled data using Fourier encoding with a conventional spin echo pulse sequence.

FIG. 12A shows the raw data and FIG. 12B shows the data after a 1D Fourier Transform (FT). FIG. 12C shows a CS reconstruction from the reduced data (R=1.5) acquired through Toeplitz random encoding sequence in FIG. 11. FIG. 12D shows a CS reconstruction from the reduced data (R=1.5) acquired through Fourier encoding with 1D variable density random sampling. FIG. 12E shows a Fourier reconstruction from the fully sampled data through Fourier encoding with the conventional spin echo pulse sequence.

Example 4

Figure 13A:
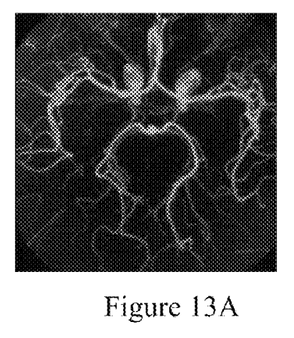
FIGS. 13A-13E show a simulation using an angiogram.
Figure 13B:
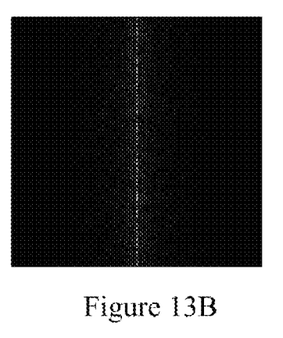
Figure 13C:
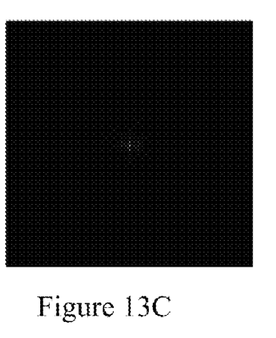
Figure 13D:
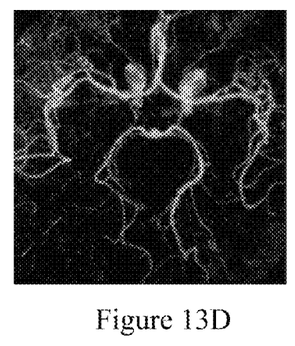
Figure 13E:
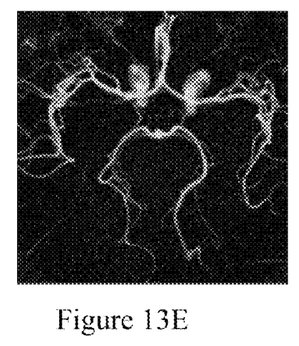

In a computer simulation, an angiogram was used as the original image. Both Toeplitz random encoding and Fourier encoding were simulated using Matlab. FIG. 13A shows the original angiogram. FIGS. 13B and 13C show the acquired data through Toeplitz random encoding and Fourier encoding respectively. FIGS. 13D and 13E show the CS reconstruction from the reduced Toeplitz random encoded data and the reduced randomly-sampled Fourier encoded data respectively, when the reduction factors are both R=1.3.

Simulations shows that Toeplitz random encoding method is better than random Fourier encoding methods, after comparing Toeplitz random encoding and Fourier encoding. As we know, most energy is focused on the low frequency for Fourier encoding. So it is not as incoherent as desirable. Toeplitz random encoding is more incoherent than Fourier encoding for natural images. For example, for the angiogram in FIG. 13A, Toeplitz random encoding spread out the energy more than Fourier encoding as shown in FIGS. 13B and 13C. The results illustrate Toeplitz has more details than Fourier when the same reduction factor is used and Toeplitz random encoding has better image quality than random Fourier encoding.

Thus, the invention provides, among other things, a method and a system for generating a magnetic resonance image of a subject. Various features and advantages of the invention are set forth in the following claims.

What is claimed is:

1. A method of generating a magnetic resonance image of a subject, the method comprising:
   generating a first pulse comprising first random data having a first amplitude and a first phase;
   applying the first pulse to the subject as a radio frequency pulse;
   collecting a first signal from the subject;
   generating a second pulse comprising second random data having a second amplitude and a second phase, wherein the second amplitude is substantially equal to the first amplitude, and wherein the second phase has a different slope from the first phase;
   applying the second pulse to the subject as a radio frequency pulse;
   collecting a second signal from the subject; and
   reconstructing an image of the subject comprising solving a complex optimization problem including a block Toeplitz matrix, wherein the block Toeplitz matrix is based on the first pulse.

2. The method of claim 1, wherein acquired data comprises the first signal and the second signal, and wherein solving a complex optimization problem comprises minimizing $\|\Psi x\|_1$ subject to $\|\Phi x - y\|_2 < \epsilon$, wherein $\Psi$ is a sparsity basis, y is the acquired data that has been subjected to a one-dimensional Fourier transform along a frequency-encoding direction, and $\Phi$ is the Toeplitz random encoding matrix, wherein the Toeplitz random encoding matrix $\Phi$ is defined as:

$$\Phi = \begin{bmatrix} A & 0 & L & 0 \\ 0 & A & L & 0 \\ M & M & O & M \\ 0 & 0 & L & A \end{bmatrix}, \text{where}$$

$$A = \begin{bmatrix} a_1 & a_2 & & a_{n-1} & a_n \\ a_2 & a_3 & & a_n & a_1 \\ M & & O & & \\ a_n & a_1 & L & a_{n-2} & a_{n-1} \end{bmatrix}.$$

3. The method of claim 1, wherein the first pulse is applied in an x direction or a y direction.

4. The method of claim 1, wherein the second pulse is applied in an x direction or a y direction.

5. The method of claim 1, wherein the first random data and the second random data comprises pseudo-random data.

6. The method of claim 1, wherein applying the first pulse comprises turning on a fixed gradient in an x direction or a y direction.

7. The method of claim 6, wherein the fixed gradient is turned off after applying the first pulse.

8. The method of claim 7, wherein the fixed gradient is a phase encoding gradient selected from the group consisting of Gx and Gy.

9. The method of claim 1, wherein applying the second pulse comprises turning on a fixed gradient in an x direction or a y direction.

10. The method of claim 9, wherein the fixed gradient is turned off after applying the first pulse.

11. The method of claim 10, wherein the fixed gradient is a phase encoding gradient selected from the group consisting of Gx and Gy.

12. A magnetic resonance imaging system having a processor and including software stored on a non-transitory computer readable medium and executable by the processor for effecting a method of generating a magnetic resonance image of a subject, the method comprising:
   generating a first pulse comprising first random data having a first amplitude and a first phase;
   applying the first pulse to the subject as a radio frequency pulse;
   collecting a first signal from the subject;
   generating a second pulse comprising second random data having a second amplitude and a second phase, wherein the second amplitude is substantially equal to the first amplitude, and wherein the second phase has a different slope from the first phase;
   applying the second pulse to the subject as a radio frequency pulse;
   collecting a second signal from the subject; and
   reconstructing an image of the subject comprising solving a complex optimization problem including a block Toeplitz matrix, wherein the block Toeplitz matrix is based on the first pulse.

13. The method of claim 12, wherein acquired data comprises the first signal and the second signal, and wherein solving a complex optimization problem comprises minimizing $\|\Psi x\|_1$ subject to $\|\Phi x - y\|_2 < \epsilon$, wherein $\Psi$ is a sparsity basis, y is the acquired data that has been subjected to a one-dimensional Fourier transform along a frequency-encoding direction, and $\Phi$ is the Toeplitz random encoding matrix, wherein the Toeplitz random encoding matrix $\Phi$ is defined as:

$$\Phi = \begin{bmatrix} A & 0 & L & 0 \\ 0 & A & L & 0 \\ M & M & O & M \\ 0 & 0 & L & A \end{bmatrix}, \text{ where}$$

$$A = \begin{bmatrix} a_1 & a_2 & & a_{n-1} & a_n \\ a_2 & a_3 & & a_n & a_1 \\ M & & O & & \\ a_n & a_1 & L & a_{n-2} & a_{n-1} \end{bmatrix}.$$

14. The method of claim 12, wherein the first pulse is applied in an x direction or a y direction.

15. The method of claim 12, wherein the second pulse is applied in an x direction or a y direction.

16. The method of claim 12, wherein the first random data and the second random data comprises pseudo-random data.

17. The method of claim 12, wherein applying the first pulse comprises turning on a fixed gradient in an x direction or a y direction.

18. The method of claim 17, wherein the fixed gradient is turned off after applying the first pulse.

19. The method of claim 18, wherein the fixed gradient is a phase encoding gradient selected from the group consisting of Gx and Gy.

20. The method of claim 12, wherein applying the second pulse comprises turning on a fixed gradient in an x direction or a y direction.

21. The method of claim 20, wherein the fixed gradient is turned off after applying the first pulse.

22. The method of claim 21, wherein the fixed gradient is a phase encoding gradient selected from the group consisting of Gx and Gy.

* * * * *